United States Patent [19]

Carnel et al.

[11] Patent Number: 5,053,697
[45] Date of Patent: Oct. 1, 1991

[54] INPUT CIRCUIT FOR AN ELECTRICAL ENERGY METER

[75] Inventors: Alain Carnel; René Gourc, both of Poitiers, France; Rudolph Kodras, Vienna, Austria

[73] Assignee: Schlumberger Industries, Montrouge, France

[21] Appl. No.: 535,699

[22] Filed: Jun. 11, 1990

[30] Foreign Application Priority Data

Jun. 16, 1989 [FR] France .................. 89 07998

[51] Int. Cl.$^5$ ............................ G01R 21/06
[52] U.S. Cl. ...................... 324/142; 324/130; 324/140 R; 324/141
[58] Field of Search ............ 324/140 R, 141, 142; 364/483, 130

[56] References Cited

U.S. PATENT DOCUMENTS

| | | | |
|---|---|---|---|
| 3,226,641 | 12/1965 | Miller | 324/142 |
| 4,182,983 | 1/1980 | Heinrich et al. | 324/142 |
| 4,250,552 | 2/1981 | Elms | 324/142 |
| 4,356,446 | 10/1982 | Battocetti | 324/140 R |
| 4,591,810 | 5/1986 | Mackenzie et al. | 324/142 |
| 4,596,951 | 6/1986 | Heinrich et al. | 324/142 |
| 4,733,171 | 3/1988 | Milkovic | 324/142 |
| 4,782,287 | 11/1988 | Marx | 324/142 |
| 4,801,874 | 1/1989 | Loeffler | 324/142 |

FOREIGN PATENT DOCUMENTS 0044528 1/1982 France.

OTHER PUBLICATIONS

Patent Abstracts of Japan, vol. 62, No. 7 (E-164), 15 Mar. 1983 & JP-A-57 207 412 (Fujitsu K. K.) 20-12-1982.

IEEE Transactions on Magnetics, vol. MAG-7, No. 3, Sep. 1971, pp. 438-442; D. R. Hamburg et al.: "An Electronic Wattmeter for Nonsinusoidal Lower Power . . . "

Patent Abstracts of Japan, vol. 94, No. 7 (E-171), 20 Apr. 1983; & JP-A-58 019 015 (NIPPON DENKI K. K..) 03-02-1983.

Primary Examiner—Kenneth A. Wieder
Assistant Examiner—William J. Burns
Attorney, Agent, or Firm—Sanford J. Asman

[57] ABSTRACT

The invention relates to an input circuit for an electrical energy meter, which circuit has a current path and a voltage path, the current path being associated with a mutual conductance transformer. In order to compensate for the differentiating function of the transformer, but without introduicng interference signals, the current path includes an active filter connected as an integrator and provided with a coupling capacitance suitable for blocking low frequency signals.

9 Claims, 2 Drawing Sheets

INPUT CIRCUIT FOR AN ELECTRICAL ENERGY METER

The present invention relates to an input circuit for a meter unit suitable for measuring electrical energy associated with voltage and current signals, the input circuit comprising a voltage sensor receiving the voltage signal, a current sensor receiving the current signal, and respective voltage and current paths for connecting said sensors to respective inputs of the meter unit, the current sensor being in the form of a mutual inductance transformer and the current path including a phase shifting active filter based on an amplifier having two inputs and one output, said amplifier being associated firstly with an AC gain adjusting resistance which is connected upstream from the first input of said amplifier, and secondly with a feedback connection including a feedback capacitance, thereby looping the output of the amplifier back onto the first input thereof.

The term "gain adjusting resistance" is used in the present description to designate any resistance which, when changed, causes the gains to be changed, and not necessarily a particular resistor which is actually changed in order to adjust gain.

BACKGROUND OF THE INVENTION

Such an input circuit is described, for example, in U.S. Pat. No. 3,226,641, granted in 1965.

As is known to the person skilled in the art, and as recalled in that prior patent, the use of a mutual inductance as a current sensor for an electrical energy meter suffers from a particular problem in that the signal available at the secondary winding of such a transformer is not an image of the signal applied to its primary, but is an image of the derivative of said signal, as a function of time.

One known way of mitigating this difficulty is to interpose a phase shifting active filter on the current path, with such a filter, as taught by the above-mentioned patent, being constituted by an integrator.

However, this solution in turn poses a new problem, which is made particularly severe nowadays by the considerable increase in the accuracy required of electronic type electrical energy meters, namely that the integrator is itself liable to generate a parasitic DC signal which may spoil the measurement performed by the meter circuit.

More generally, the unavoidable physical defects of the components used in the input circuit, in particular in the mutual inductance transformer and in the active filter, have the overall effect of the signal delivered by the active filter not necessarily constituting a true image of the current to be measured, in particular when the active filter is a conventional integrator, and thus subject to a voltage offset.

In this context, a first object of the invention is to provide and input circuit for an electrical energy meter where the transfer function is such that the input circuit has no parasitic effect on the signal to be measured.

SUMMARY OF THE INVENTION

To this end, in the circuit of the invention, the phase shifting active filter further includes a coupling capacitance connected to the output of the amplifier upstream from the feedback connection, in addition to the AC gain adjusting resistance and the feedback capacitance.

Preferably, the active filter also includes a DC gain-limiting resistance directly connecting the output of the amplifier to the first input thereof.

In which case, the active filter may additionally include an output filter comprising a passive RC filter of the integrator type connected upstream from the two inputs to the amplifier, thereby compensating for a difference between the phase shift imparted by the active filter and a predetermined value desired for said phase shift.

In order to make the active filter even more insensitive to the load connected to its output, a voltage divider may be connected to the output of the active filter upstream from said load.

In the circuit of the invention, there is no need for the voltage sensor to be particularly elaborate, and on the contrary, it may be constituted merely by a voltage divider having an output connected to a junction terminal between the first impedance receiving the voltage signal and a second impedance connected to a reference voltage.

For a final correction of phase error in the active filter, and when the circuit is applied to an active energy meter, the first impedance of said voltage divider may nevertheless comprise a capacitance.

In an application of the circuit to a reactive electrical energy meter, the active filter may comprise a leakage resistance connected in parallel with the feedback capacitance, said filter then operating with a phase shift of 45°.

In the reactive case, it is also possible to provide for the voltage path to include a second passive RC filter of the integrator type, likewise operating at a phase shift of 45°.

A resistance is then preferably connected in parallel with the capacitance of the second passive RC filter.

BRIEF DESCRIPTION OF THE DRAWINGS

Embodiments of the invention are described by way of example with reference to the accompanying drawings, in which.

DETAILED DESCRIPTION

Figure 1:
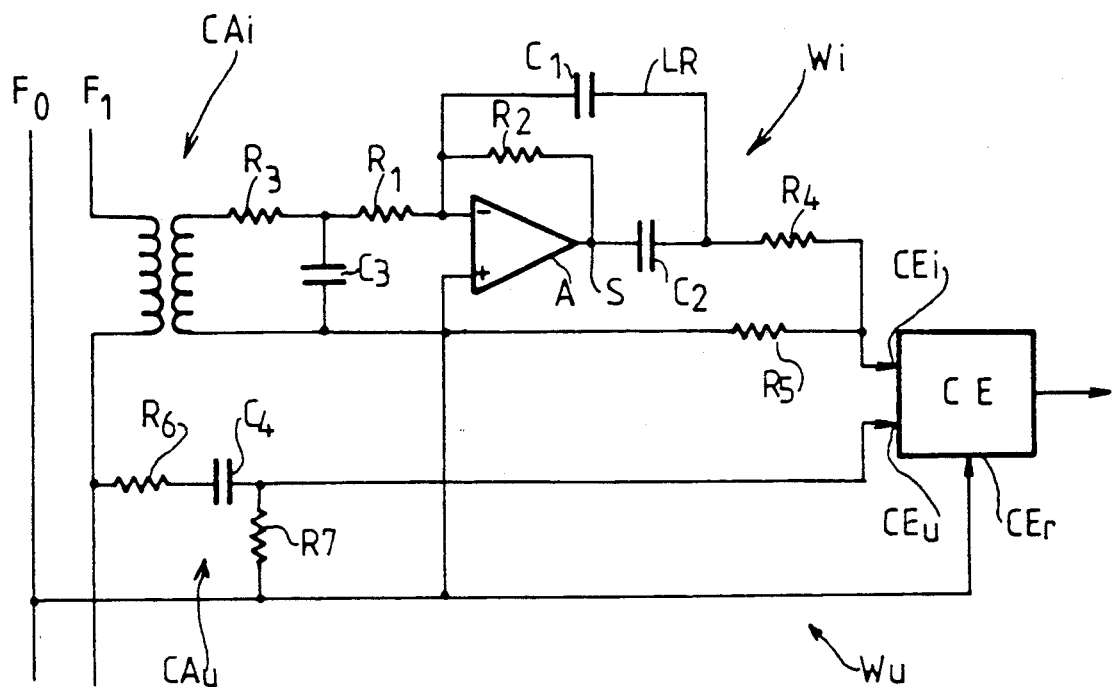
FIG. 1 is an electrical circuit diagram of one possible embodiment of an input circuit in accordance with the invention for use with an active energy meter.

In FIG. 1, F0 and F1 represent two conductors of an electricity distribution network, which conductors may be connected to loads (not shown) capable of consuming a certain quantity of energy, which energy is to be measured by an electronic meter unit CE.

The desired quantity of energy depends firstly on the current flowing along the conductor F1 (or the conductor F0), and secondly on the voltage that exists between the conductors F0 and F1.

The signals associated with said current and with said voltage are detected by a current sensor CAi and a voltage sensor CAu respectively which provide signals derived therefrom, which signals are transmitted to respective inputs CEi and CEu of the meter unit via a current path Wi and a voltage path Wu, respectively.

In the present case, the current sensor is a mutual inductance transformer, i.e. a transformer essentially constituted by a primary winding and a secondary winding with direct electromagnetic coupling through air.

The current path Wi comprises a phase shifting active filter using an amplifier A having an inverting input A−, a non-inverting input A+, and an output S.

The amplifier is associated firstly with an AC gain adjusting resistance R1 connected upstream from the inverting input A−, and secondly with a feedback connection LR having a feedback capacitance C1 interposed therein, said connection looping the output S of the amplifier back to the inverting input thereof.

According to an essential characteristic of the invention, the phase shifting active filter also includes a coupling capacitance C2 connected to the output of the amplifier upstream from the feedback connection LR.

The amplifier A in combination with the resistance R1 and the feedback capacitance C1 constitutes a conventional integrator known for applying a phase shift of 90° to any AC signal applied to the resistance R1 together with attenuation proportional to the frequency of the signal, which would therefore provide a simple way of compensating for the opposite phase shift and amplification imparted by the sensor CAi, were it not for undesirable parasitic effects that are also included.

In contrast, the amplifier A in combination with the resistance R1 and capacitances C1 and C2 ceases to behave like a conventional integrator since the capacitance C2 impedes the flow of low frequency currents. The relatively complex behavior of this filter is described below.

In addition to the items already mentioned, the active filter preferably includes a DC gain limiting resistance R2 directly connecting the output S of the amplifier A to the inverting input thereof, thereby having the beneficial effect of preventing the amplifier from saturating by integrating its own offset voltage, but having the undesirable effect of further removing the characteristics of the active filter A, R1, C1, R2, C2 from the characteristics of an ideal integrator.

Under these conditions, and at least over a wide range of frequencies, the action of this filter no longer compensates the action on the mutual inductance transformer CAi which itself constitutes a practically ideal differentiator, at least for signals in the useful frequency range.

In order to mitigate this difficulty, the active filter is preferably provided with an integrating type passive RC filter constituted by resistance R3 and capacitance C3 connected upstream from the A− and A+ inputs of the amplifier A, the passive filter being designed to ensure that the total phase shift of the assembly A, C1, C2, C3, R1, R2, and R3 has a value of 90° at the outlet end thereof, which in the application shown in FIG. 1 is constituted by an active energy meter unit.

In addition to its function of correcting phase shift error, the passive filter R3C3 has the advantage effect of damping high amplitude high frequency transient waves that the current sensor may generate due to its behavior as a differentiator.

In order to make the active filter insensitive to the external load to which it is connected, and in order to reduce the size and the capacitance of C2 as much as possible, it may be advantageous to connect a voltage divider such as R4, R5 at the output of the active filter A, R1, C1, C2, R2.

The voltage sensor may simply be constituted by a voltage divider having an output connected to a junction terminal between a first impedance R6C4 receiving the voltage signal and a second impedance R7 connected to a reference voltage.

In this case, any possible residual phase shifting error applied by the active filter and represented by a change in phase as a function of frequency may be compensated by making the first impedance in the form of a resistance and a capacitance connected in series, while the second impedance is purely resistive in nature.

The reference potential common to the current path Wi and to the voltage path Wu, and also to the meter unit CE, may be constituted by the potential of the neutral conductor F0, for example, having the capacitance C3, the non-inverting input A+ of the amplifier A, the resistance R5, the resistance R7, and the reference potential input CEr of the meter unit CE all connected thereto.

Figure 3:
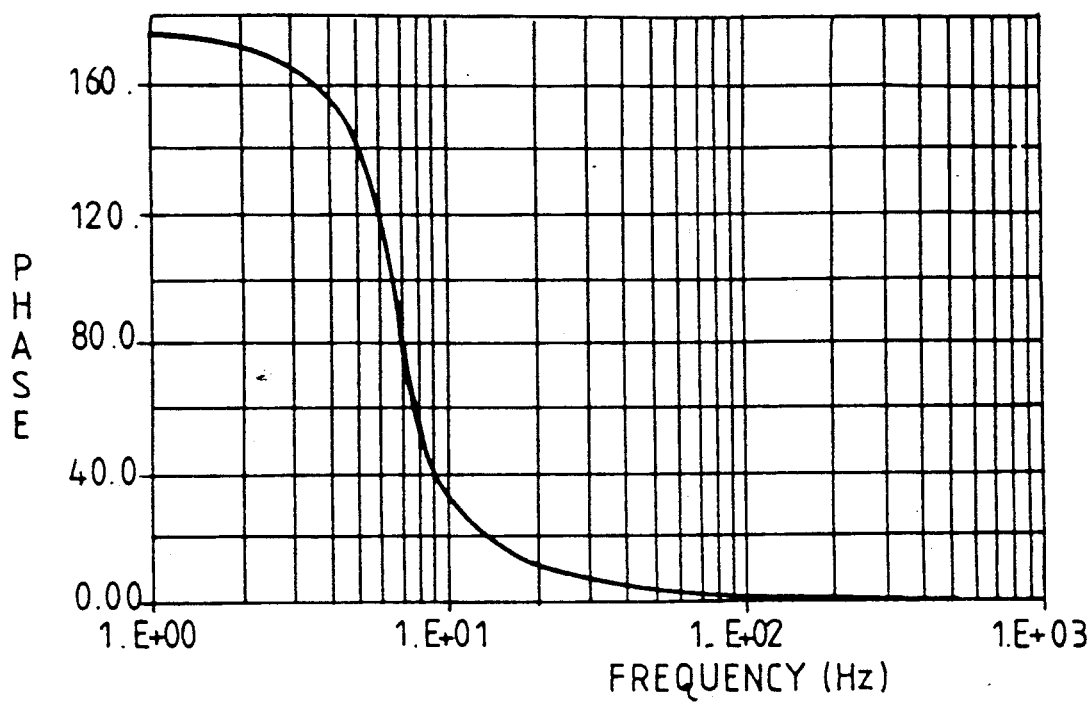
FIG. 3 is a graph showing the response of a portion of the FIG. 1 circuit, in terms of the relative phase of an output signal plotted up the Y axis as a function of frequency plotted along the X axis, for a signal applied to the input of said circuit portion.
Figure 4:
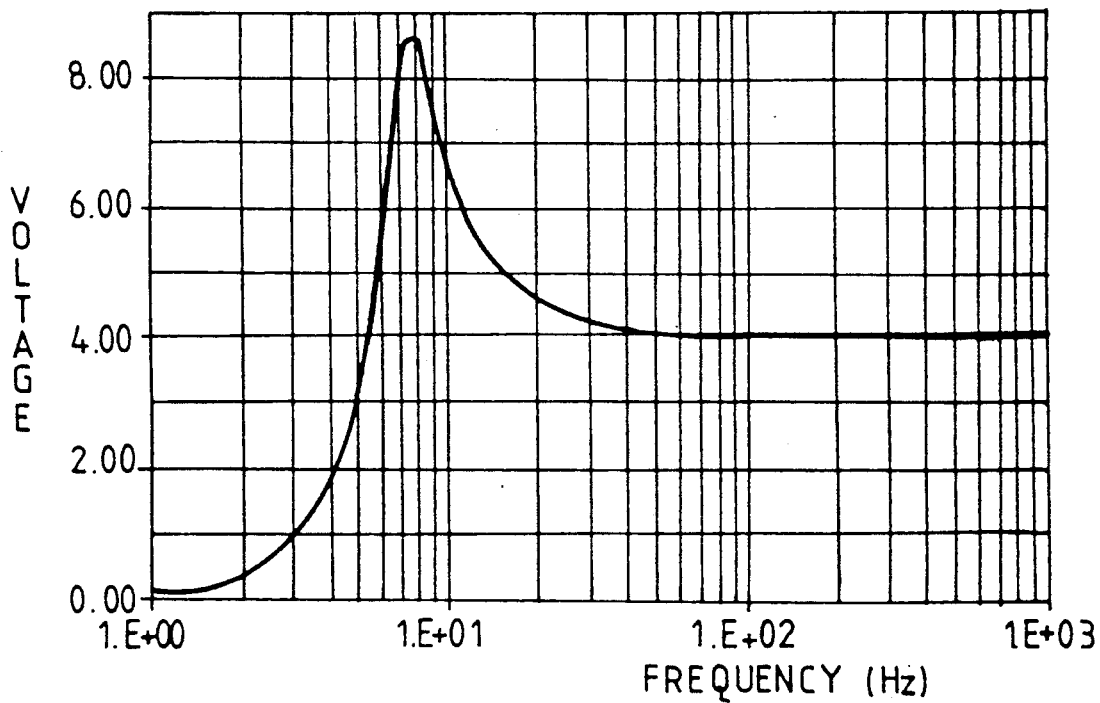
FIG. 4 is a graph showing the response of the same portion of the FIG. 1 circuit, in terms of the voltage of an output signal plotted up the Y axis as a function of frequency plotted along the X axis, for a signal applied to the input of said circuit portion.

FIGS. 3 and 4 relate to the overall transfer function of the combination of the current sensor CAi and of the active filter A, R1, C1, R2, C2, with the passive filter R3C3 being excluded from this combination.

As shown in FIG. 3, this combination behaves almost like a polarity inverter for signals having a frequency of about 1 Hz, like a 90° phase shifter for signals having a frequency of about 7 Hz, and like a phase shifter whose effect tends to zero for signals having a frequency of about 50 Hz or more.

Similarly, FIG. 4 shows that signals at a frequency of less than 2 Hz are hardly transmitted at all, signals having a frequency of about 7 Hz give rise to resonance which amplifies them, and signals from about 50 Hz up are restored without change in amplitude.

The guiding principles for making a practical embodiment of the circuit shown in FIG. 1 are as follows.

The resistance R1 should be high relative to the resistance of the secondary winding of the current sensor CAi, for example it should not be less than 100 times said resistance. One possible practical value is 78,800 ohms.

The capacitance C1 may be 10 nF, for example, while C2 may be about 2.2 μF.

The resistance R2 should be at a fixed large value, e.g. 4.7 megohms, while suitable values for the resistances R4 and R5 are respectively about 3,000 ohms and 2,000 ohms.

If R4 is given a smaller value, then C1 should have a larger value so that the product (R4+R5).C1 remains substantially constant.

Suitable values for the resistance R3 and the capacitance C3 are 78,800 ohms and 1.2 nF, respectively.

Suitable values for the resistance R6, the resistance R7, and the capacitance C4 are 392,000 ohms, 2,600 ohms, to 4,000 ohms, and 68 nF, respectively.

Figure 2:
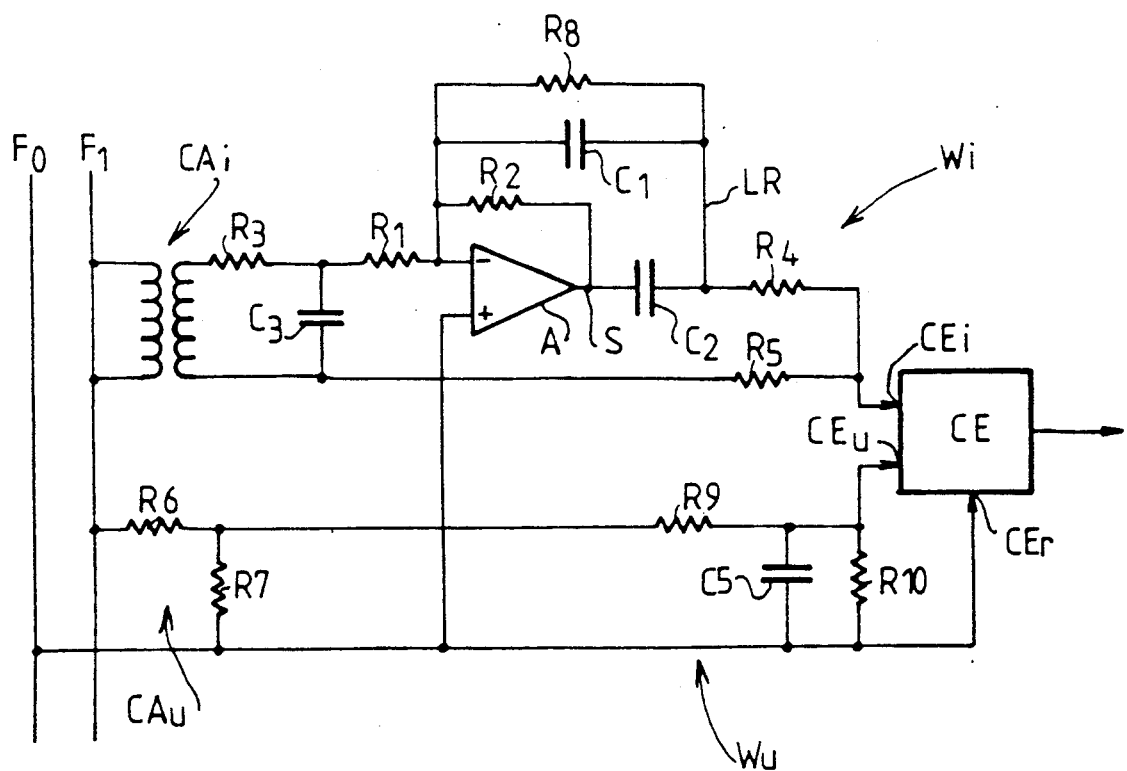
FIG. 2 is an electrical circuit diagram of one possible embodiment of an input circuit in accordance with the invention for use with a reactive energy meter.

FIG. 2 shows a circuit analogous to the circuit of FIG. 1, except insofar as it is for use with a reactive energy meter unit.

This means that in this application the relative phase shift between the voltage and current signals provided to the inputs CEi and CEu of the meter unit CE should differ by 90° from the relative phase shift of the voltage and current signal actually available on the conductors F0 and F1.

Since the current sensor CAi itself imparts a phase rotation of 90° to the current signal and amplifies it proportional to its frequency, the voltage path Wu and the current path Wi are not subjected, a priori, to any constraint other than imparting the same phase shift (possibly zero) to the signals that they transmit together with attenuation of the current and voltage signals suitable for compensating the amplification applied by the sensor CAi to the current signal, and proportional to the frequency of the signal.

The solution of the invention consists in causing each of the voltage and current paths to impart a respective phase shift of 45° and a corresponding attenuation of the signal, thereby causing its amplitude to be at least approximately proportional to the square root of the reciprocal of the frequency common to the voltage signal and to the current signal, with the attenuation in the two paths thus compensating the amplification proportional to frequency as imparted by the current sensor CAi, with respect to the signal representative of reactive energy as delivered by the meter unit CE.

Items which perform similar functions in FIGS. 1 and 2 are given identical reference numerals in both of them.

Thus, in addition to the items already described above with respect to FIG. 1, the circuit of FIG. 2 shows a leakage resistance R8 connected in parallel with the feedback capacitance C1 and having the purpose of changing the phase shift imparted by the active filter A, R1, C1, R2, C2, R3, C3 to a value of 45°.

The voltage path Wu is still essentially constituted by a voltage divider R6, R7 suitable for substantially reducing the voltage available between the conductors F0 and F1.

In addition to these items, this path also includes a second passive RC filter of the integrator type comprising a series resistance R9 and a parallel capacitance C5, such that this filter likewise imparts a phase shift of 45°.

As shown in FIG. 2, a resistance R10 is preferably connected in parallel with the capacitance C5 so as to reduce the voltage thereacross.

As will readily be understood by the person skilled in the art, the components R6, R7, R9, R10 and C5 could be combined by conventional equivalent impedance calculation in order to reduce the number of components used, if necessary.

In the circuit of FIG. 2, the current path Wi and the voltage path Wu apply amplification to the current and voltage signals respectively which is substantially proportional to the square root of the reciprocal of the frequency common to these signals.

The combined contribution of the voltage and current paths therefore gives rise to attenuation in the signal representative of energy which compensates for the amplification imparted by the current sensor CAi regardless of the frequency of the current and voltage signals, at least over a certain range about their nominal frequencies.

In addition, insofar as the voltage path Wu and the current path Wi are designed to impart the same phase shift of 45°, and assuming that changes in the frequency of the current and voltage signals do not have any significant effect on the equality of the phase shifts imparted by the voltage and current paths, the circuit of FIG. 2, when compared with conventional circuits, presents the advantage of compensating both for phase errors and for amplitude errors in the current and voltage signals available on the conductors F0 and F1, which errors would normally appear for variations in frequency about the common nominal values.

We claim:

1. An input circuit for a meter unit suitable for measuring electrical energy associated with voltage and current signals, the input circuit comprising: a voltage sensor receiving the voltage signal, a current sensor receiving the current signal, and respective voltage and current paths for connecting said sensors to respective inputs of the meter unit, the current sensor being in the form of a mutual inductance transformer and the current path including a phase shifting active filter based on an amplifier having two inputs and one output, said amplifier being associated firstly with an AC gain adjusting resistance which is connected upstream from the first input of said amplifier, and secondly with a feedback connection including a feedback capacitance, thereby looping the output of the amplifier back onto the first input thereof, wherein the phase shifting active filter further includes a coupling capacitance connected between the output of the amplifier and the feedback connection.

2. A circuit according to claim 1, wherein the active filter includes a DC gain-limiting resistance directly connecting the output of the amplifier to the first input thereof.

3. A circuit according to claim 2, wherein the output filter comprises a passive RC filter of the integrator type connected upstream from the two inputs to the amplifier, thereby compensating for a difference between the phase shift imparted by the active filter and a predetermined value desired for said phase shift.

4. A circuit according to claim 1, wherein a voltage divider is connected to the output of the active filter.

5. A circuit according to claim 1, wherein the voltage sensor comprises a voltage divider having an output connected to the junction terminal between a first impedance receiving the voltage signal and a second impedance connected to a reference voltage.

6. A circuit according to claim 5, wherein the first impedance includes a capacitance.

7. An input circuit for a meter unit suitable for measuring electrical energy associated with voltage and current signals, the input circuit comprising; a voltage sensor receiving the voltage signal, a current sensor receiving the current signal, and respective voltage and current paths for connecting said sensors to respective inputs of the meter unit, the current sensor being in the form of a mutual inductance transformer and the current path including a phase shifting active filter based on an amplifier having two inputs and one output, said amplifier being associated firstly with an AC gain adjusting resistance which is connected upstream from the first input of said amplifier, and secondly with a feedback connection including a feedback capacitance, thereby looping the output of the amplifier back onto the first input thereof, wherein the phase shifting active filter further includes a coupling capacitance connected to the output of the amplifier upstream from the feedback connection, wherein in order to provide a phase shift of 45°, the active filter comprises a leakage resistance connected in parallel with the feedback capacitance, said circuit being intended for a reactive electrical energy meter.

8. A circuit according to claim 7, wherein the voltage path comprises a second passive RC filter of the integrator type, likewise imparting a phase shift of 45°.

9. A circuit according to claim 8, wherein a resistance is connected in parallel with the capacitance of the second RC filter.

* * * * *